United States Patent
Earl et al.

(10) Patent No.: US 7,245,180 B2
(45) Date of Patent: Jul. 17, 2007

(54) INTELLIGENT RF POWER CONTROL FOR WIRELESS MODEM DEVICES

(75) Inventors: Paul Earl, Apex, NC (US); Christopher Hahn, Apex, NC (US)

(73) Assignee: Sony Ericsson Mobile Communications AB, Lund (SE)

( * ) Notice: Subject to any disclaimer, the term of this patent is extended or adjusted under 35 U.S.C. 154(b) by 94 days.

(21) Appl. No.: 11/161,405

(22) Filed: Aug. 2, 2005

(65) Prior Publication Data
US 2007/0030712 A1    Feb. 8, 2007

(51) Int. Cl.
*H03G 5/16* (2006.01)
(52) U.S. Cl. ............... 330/133; 375/295; 375/302; 455/127.1; 455/127.4
(58) Field of Classification Search ........... 375/302, 375/295; 455/127.1, 127.4
See application file for complete search history.

(56) References Cited

U.S. PATENT DOCUMENTS

| 5,670,911 | A | | 9/1997 | Hori et al. | |
|---|---|---|---|---|---|
| 5,798,648 | A | * | 8/1998 | Ueyama et al. | 324/548 |
| 5,802,480 | A | * | 9/1998 | Shiraishi | 701/45 |
| 6,130,813 | A | * | 10/2000 | Kates et al. | 361/93.1 |
| 6,377,784 | B2 | * | 4/2002 | McCune | 455/108 |
| 6,567,475 | B1 | * | 5/2003 | Dent et al. | 375/286 |
| 2002/0015319 | A1 | * | 2/2002 | Hartular et al. | 363/56.05 |
| 2003/0107440 | A1 | | 6/2003 | Miki et al. | |
| 2003/0155972 | A1 | * | 8/2003 | Ngo et al. | 330/133 |
| 2004/0183512 | A1 | * | 9/2004 | McCune | 323/282 |
| 2005/0064830 | A1 | * | 3/2005 | Grigore | 455/127.4 |
| 2005/0220219 | A1 | * | 10/2005 | Jensen | 375/302 |
| 2006/0178121 | A1 | * | 8/2006 | Hamalainen et al. | 455/125 |

FOREIGN PATENT DOCUMENTS

| EP | 1 482 636 A1 | 12/2004 |
|---|---|---|
| EP | 1 530 303 A1 | 5/2005 |

* cited by examiner

*Primary Examiner*—Robert L. Deberadinis
*Assistant Examiner*—Tien Mai
(74) *Attorney, Agent, or Firm*—Gregory A. Stephens; Moore & Van Allen PLLC

(57) ABSTRACT

A bypass circuit is disclosed for use with lower power supply voltage PC cards. The bypass circuit controls the power supply voltage fed to a power amplifier when switching between a lower power 8-PSK modulation mode and a higher power GMSK modulation mode. A step-up DC/DC converter provides a higher voltage to the power amplifier than can be supplied by an original power supply. Switch control logic controls a step-up switch and a battery switch. The step-up switch is turned on when operating in an 8-PSK modulation mode to provide a higher voltage to the power amplifier than the original power supply voltage. The battery switch is turned on when operating in the GMSK modulation mode to provide the original power supply voltage to the power amplifier.

5 Claims, 2 Drawing Sheets

INTELLIGENT RF POWER CONTROL FOR WIRELESS MODEM DEVICES

DESCRIPTION

List of Acronyms

The following Acronyms are used throughout the specification.

EDGE—Enhanced Data for GSM Evolution
EGPRS—Enhanced General Packet Radio Service
GMSK—Guassian Minimum Shift Keying
GPRS—General Packet Radio Service
GSM—Global System for Mobile Communication
PCMCIA—Personal Computer Memory Card international Association
PSK—Phase Shift Keying

BACKGROUND

Power amplifiers used in GSM/GPRS/EGPRS cellular handsets are designed to operate from a battery that provides a typical power supply voltage of 3.6 volts, Unfortunately, using the same power amplifier in a PC card application is problematic since the power supply voltage is nominally 3.3 volts for PC cards. The lower operating voltage of the PC card makes it very difficult to meet the requirement for an 8-PSK transmit modulation spectrum at maximum output power as defined in the GSM 05.05 cellular telephony specification. This particular problem has been resolved by designing a step-up DC-to-DC converter to boost the voltage at the power amplifier to 3.6 volts.

Boosting the power amplifier supply voltage to 3.6 volts works well when a PC card is operating in EDGE mode due to lower transmit output power requirements. However, when a PC card is operating at higher output powers like those required for GMSK modulation modes, the inefficiency of the step-up DC-to-DC boost converter results in a violation of the PCMCIA current consumption specification. Additionally, GMSK modulation is a constant envelope and the power amplifier is run saturated. Thus, it is not necessary to boost the power amplifier supply voltage.

What is needed is a means for optimizing power amplifier performance in lower power supply voltage PC card applications to allow for efficient operation in both the 8-PSK and GMSK modulation modes for GSM data exchange standards such as GPRS and EDGE.

SUMMARY

A bypass circuit is disclosed for use with lower power supply voltage PC cards. The bypass circuit controls the power supply voltage fed to a power amplifier when switching between a lower power 8-PSK modulation mode and a higher power GMSK modulation mode. A step-up DC/DC converter provides a higher voltage to the power amplifier than can be supplied by an original power supply. Switch control logic controls a step-up switch and a battery switch. The step-up switch is turned on when operating in an 8-PSK modulation mode to provide a higher voltage to the power amplifier than the original power supply voltage. The battery switch is turned on when operating in the GMSK modulation mode to provide the original power supply voltage to the power amplifier.

A comparator circuit delays the enabling of the battery switch until the capacitor voltage drops to or below the original power supply voltage to prevent the capacitor from feeding current to the original power supply.

In addition, the switch control logic includes a counter to keep track of the number of GMSK frames encountered between 8-PSK frames. When a maximum number of GMSK frames is encountered the switch control logic affirmatively determines that GMSK modulation mode is back in operation. The step-up switch and battery switch can then be operated accordingly to prevent any degradation in EDGE performance.

DETAILED DESCRIPTION

The present invention describes and discloses a means for optimizing power amplifier performance in which a battery can be used in high transmit power conditions, and a boosted voltage can be used for lower TX power conditions.

Figure 1:
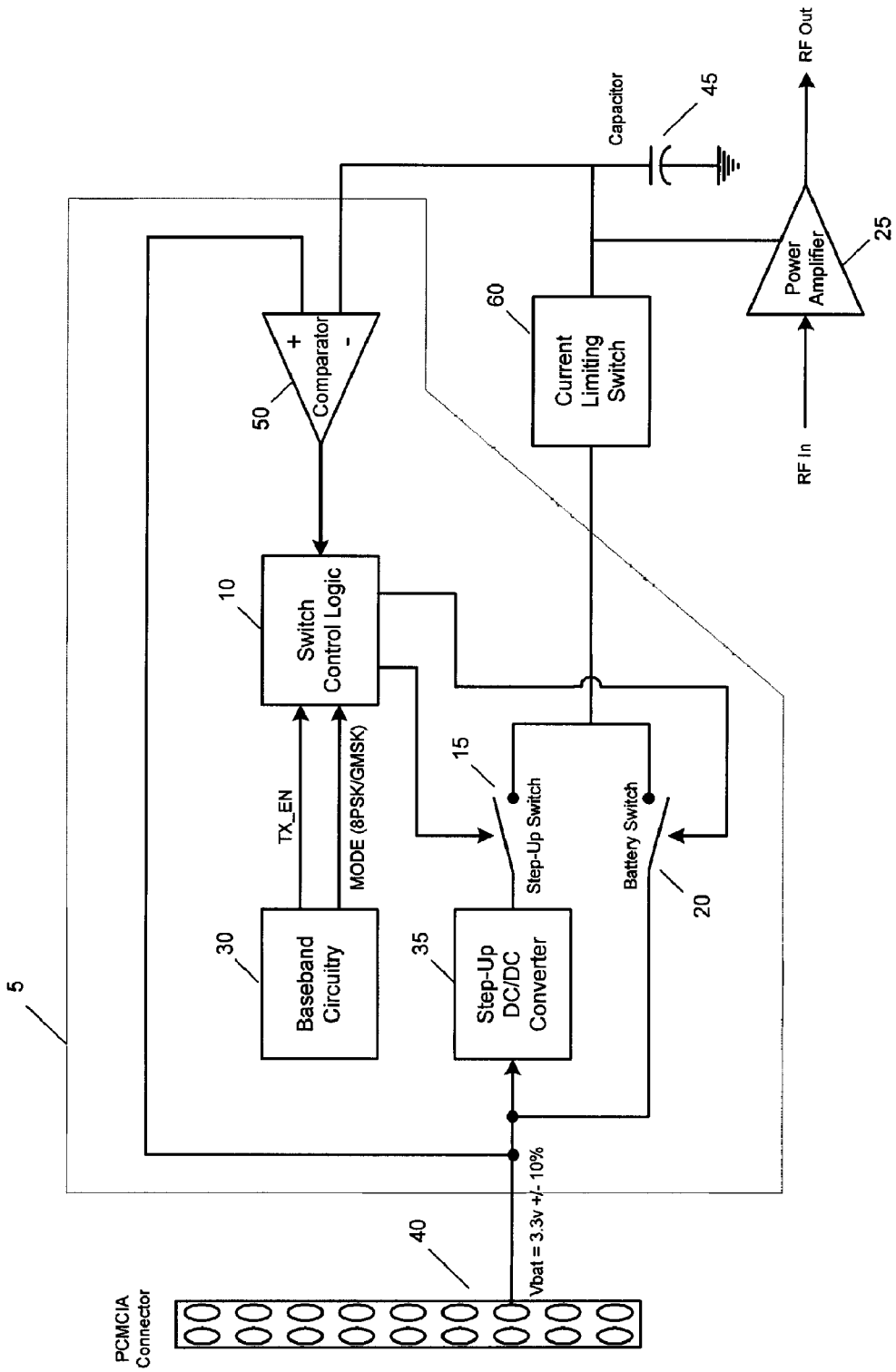
FIG. 1 is a circuit block diagram describing one embodiment of the present invention.

In one embodiment shown in FIG. 1, there is disclosure for PC cards that can use both GSMK (high TX power/high current) and 8-PSK (low TX power/lower current) modulation modes. This is accomplished by designing a GSM/GPRS/EGPRS PC Card with a boost power supply that incorporates bypass circuitry for operating in GMSK modulation mode. The bypass circuitry makes it is possible to meet the requirements of an 8-PSK transmit modulation spectrum and maintain the lowest possible GMSK current consumption.

Referring to FIG. 1, a bypass circuit 5 is comprised of switch control logic 10, a step-up DC/DC converter 35, a step-up switch 15, a battery switch 20, baseband circuitry 30, and a comparator circuit 50. The switch control logic 10 is used to control two load switches, a step-up switch 15, and a battery switch 20, to a power amplifier 25. When the baseband circuitry 30 is in the 8-PSK mode, a step-up DC/DC converter 35 is used to provide a higher voltage (~3.6 v) to the power amplifier 25. When the baseband circuitry 30 is in the GMSK mode, the switch control logic 10 routes the current to the power amplifier 25 from the battery ($V_{bat}$) 40 by engaging battery switch 20. Battery power ($V_{bat}$ 40) is received by way of a PC card connection to an original power supply source (not shown). Thus, the term $V_{bat}$ 40 refers to the voltage supplied by the original power supply. In addition, a current limiting switch 60 is used to prevent the power amplifier 25 from drawing all the current from the original power supply.

There are two additional problems that the bypass circuit of the present invention solved to work properly. First, a capacitor 45 at the power amplifier 25 will want to feed current to the battery 40 when the step-up DC/DC converter step-up switch 15 turns off and the battery switch 20 turns on. Second, EDGE utilizes both 8-PSK and GMSK frames.

For the first problem, switching from an 8-PSK to a GMSK modulation mode will cause the capacitor 45 to immediately change from 3.6 v to the battery voltage (nominally 3.3 v for PC card applications). Since the capacitor 45 is at a higher voltage, it will start feeding current to the battery 40. In order to prevent this scenario, a comparator circuit 50 is used to delay the enabling of the battery load switch 20 in the embodiment of FIG. 1.

The comparator circuit 50 compares the capacitor voltage and the battery voltage. The comparator circuit 50 is biased so that there are two states. The first state is when capacitor voltage is greater than the battery voltage and the second state is when the capacitor voltage is less than or equal to the battery voltage. With the comparator circuit 50 in place, both the step-up switch 15 and the battery switch 20 will be off after a change from 8-PSK modulation mode to GMSK modulation mode, and the power amplifier 25 will receive current only from the capacitor 45. As this current is being received, the capacitor voltage will drop. When the capacitor voltage drops to or below the battery voltage, the switch control logic 10 will turn on the battery load switch 20.

For the second problem, certain encoding schemes defined in the EDGE standard use both 8-PSK and GMSK frames. This means that the circuit could be constantly switching between 3.3 v and 3.6 v. This is not a problem from a current perspective since the comparator circuit 50 is in place to prevent the capacitor 45 from sourcing current to the battery 40. However, overall EDGE performance could suffer. To prevent EDGE degradation, a counter in the switch control logic 10 is used to "filter" out the GMSK frames. The counter is set so that the step-up DC/DC converter load switches 15, 20 do not turn off until it is known that the application has really switched to the GMSK modulation mode.

This is done by using a transmission enable signal (TX_EN) from the baseband circuitry 30 to clock in the mode of every frame and resetting the counter whenever an 8-PSK frame is encountered. A maximum number of GMSK frames can exist between 8-PSK frames. So, once the maximum number of GMSK frames is counted, the switch control logic 10 determines that the application is back in GMSK mode.

Figure 2:
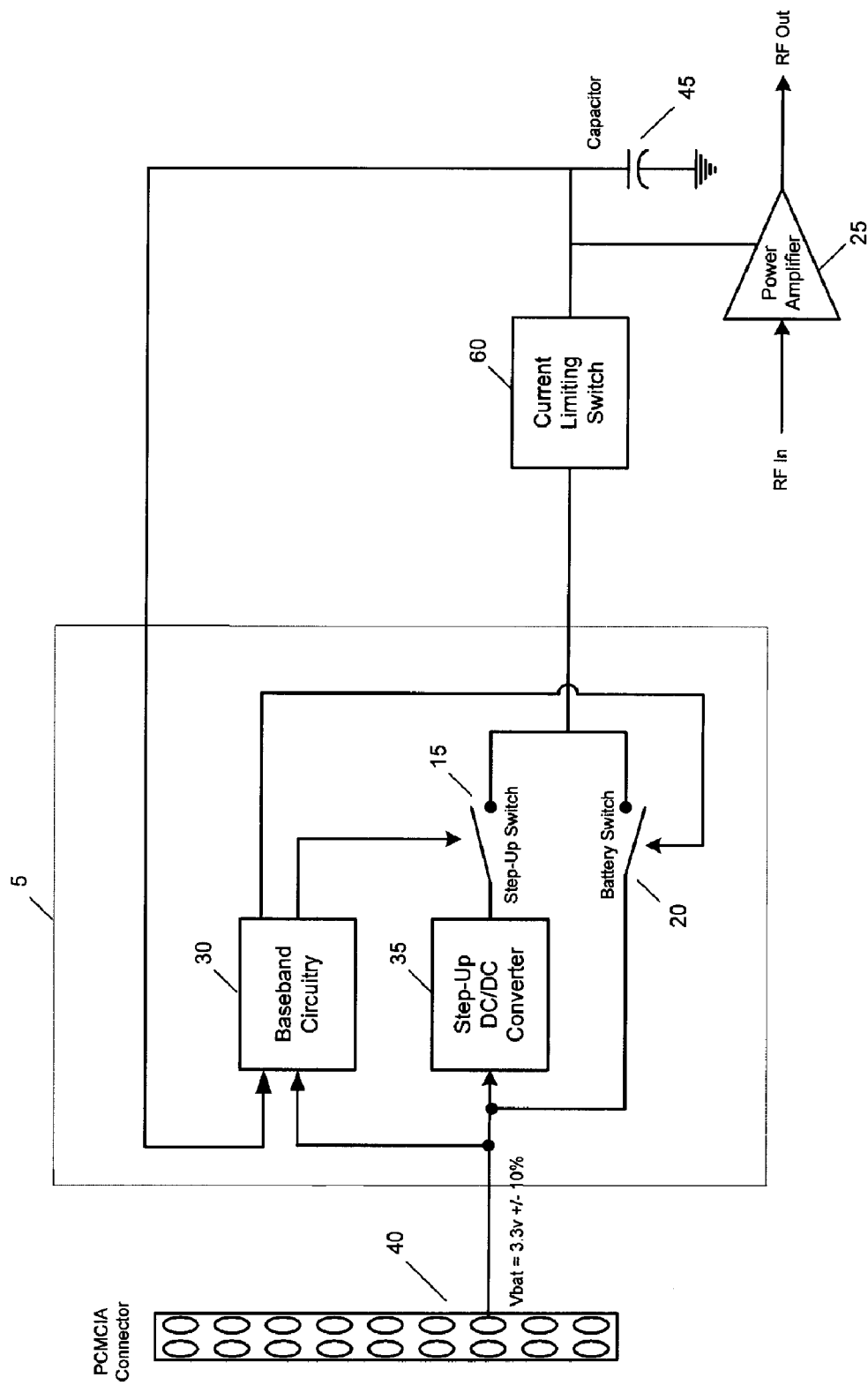
FIG. 2 is a circuit block diagram describing another embodiment of the present invention.

The comparator circuit 50 shown in FIG. 1 is implemented in hardware. In the embodiment of FIG. 2, an alternate approach that replaces the comparator circuit 50 is used. In this embodiment, the voltages on the incoming battery $V_{bat}$ 40 and the capacitor 45 are sensed using analog-to-digital (A/D) converters available in the baseband circuitry 30. Software reads the voltages from the A/D converters and configures the load switches accordingly. For instance, when the voltage for capacitor 45 is sensed to be greater than the voltage for $V_{bat}$ 40 capacitor 45 the step-up switch 15 and battery switch 20 are kept off. Once the voltage for capacitor 45 is sensed to be less than or equal to the voltage for $V_{bat}$ 40 capacitor 45, the baseband circuitry would activate the battery switch 20.

Specific embodiments of an invention are disclosed herein. One of ordinary skill in the art will readily recognize that the invention may have other applications in other environments. In fact, many embodiments and implementations are possible. The following claims are in no way intended to limit the scope of the present invention to the specific embodiments described above. In addition, any recitation of "means for" is intended to evoke a means-plus-function reading of an element and a claim, whereas, any elements that do not specifically use the recitation "means for", are not intended to be read as means-plus-function elements, even if the claim otherwise includes the word "means".

What is claimed is:

1. A bypass circuit for use with PC cards, the bypass circuit for controlling the power supply voltage fed to a power amplifier when switching between a 8-PSK modulation mode and a GMSK modulation mode, the bypass circuit comprising:
   a step-up DC/DC converter capable of providing a higher voltage to the power amplifier than can be supplied by an original power supply;
   a step-up switch;
   a battery switch; and
   switch control logic for controlling the step-up switch and the battery switch such that the step-up switch is turned on when operating in the 8-PSK modulation mode to provide a stepped-up higher voltage to the power amplifier than the original power supply voltage and the battery switch is turned on when operating in the GMSK modulation mode to provide the original power supply voltage to the power amplifier.

2. The bypass circuit of claim 1 further comprising a comparator circuit to delay the enabling of the battery switch until the voltage of a capacitor drops to or below the original power supply voltage to prevent the capacitor from feeding current to the original power supply.

3. The bypass circuit of claim 1 further comprising:
   A/D converters for sensing the voltages on a capacitor and the original power supply such that the enabling of the battery switch is delayed until the capacitor voltage is sensed to be at or below the original power supply voltage thereby preventing the capacitor from feeding current to the original power supply.

4. The bypass circuit of claim 1 wherein the switch control logic further comprises a counter to keep track of the number of GMSK frames encountered between 8-PSK frames such that when a maximum number of GMSK frames is encountered the switch control logic affirmatively determines that GMSK modulation mode is back in operation and can operate the step-up switch and a battery switch accordingly to prevent any degradation in EDGE performance.

5. A bypass circuit for controlling the power supply voltage fed to a power amplifier when switching between an application which can be boosted to a higher power amplifier voltage having more margin for current according to the PCMCIA specification; and an application with no current margin, but can tolerate lower PA voltages, the bypass circuit comprising:
   a step-up DC/DC converter capable of providing a higher voltage to the power amplifier than can be supplied by an original power supply;
   a step-up switch;
   a battery switch; and
   switch control logic for controlling the step-up switch and the battery switch such that the step-up switch is turned to provide a stepped-up higher voltage to the power amplifier than the original power supply voltage and the battery switch is turned on to provide the original power supply voltage to the power amplifier.

* * * * *